United States Patent
Yamada et al.

(10) Patent No.: US 6,444,991 B1
(45) Date of Patent: Sep. 3, 2002

(54) SCANNING CHARGED-PARTICLE BEAM INSTRUMENT

(75) Inventors: Atsushi Yamada; Tsutomu Negishi; Toshiharu Kobayashi; Norio Watanabe, all of Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 09/619,450

(22) Filed: Jul. 19, 2000

(30) Foreign Application Priority Data

Jul. 19, 1999 (JP) .......................................... 11-204266

(51) Int. Cl.$^7$ ................................................ H01J 37/20
(52) U.S. Cl. .................................. 250/442.11; 250/310
(58) Field of Search ................................. 250/306, 311, 250/492.21, 492.3, 442.11, 491.1, 310, 309

(56) References Cited

U.S. PATENT DOCUMENTS

| | | | |
|---|---|---|---|
| 3,737,659 A | * 6/1973 | Yanaka et al. ............. | 250/49.5 |
| 4,627,009 A | 12/1986 | Holmes et al. ............. | 364/559 |
| 4,803,358 A | 2/1989 | Kato et al. .................. | 250/310 |
| 5,481,111 A | * 1/1996 | Rosar et al. ................ | 250/311 |
| 5,591,980 A | * 1/1997 | Ogasawara et al. ...... | 250/442.11 |
| 6,118,122 A | * 9/2000 | Koyama et al. ............ | 250/309 |

FOREIGN PATENT DOCUMENTS

JP 6376251 6/1988

* cited by examiner

*Primary Examiner*—Kiet T. Nguyen
(74) *Attorney, Agent, or Firm*—Webb Ziesenheim Logsdon Orkin & Hanson, P.C.

(57) ABSTRACT

There is disclosed a scanning electron charged-particle beam instrument in which the image does not escape during rotation even if the center of mechanical rotation is not coincident with the center of the image. The instrument is so operated that the center position of the image is fixed when a mechanical rotation is made if the center of mechanical rotation is not coincident with the center of the image. For this purpose, when the specimen stage assembly is rotated mechanically, the X-stage of the specimen stage assembly is driven to move in the X-direction. The Y-stage of the stage assembly is driven to move in the Y-direction. The distance L between the center of mechanical rotation and the moving speed of the X-Y stage are interlinked. The apparent speed of the rotational speed of the image on the viewing screen is made constant irrespective of the distance L. In practice, the moving speed of the X-Y stage is increased with increasing the distance L.

4 Claims, 4 Drawing Sheets

SCANNING CHARGED-PARTICLE BEAM INSTRUMENT

BACKGROUND OF THE INVENTION

1. Field of the Invention

The present invention relates to a scanning charged-particle beam instrument such as a scanning electron microscope.

2. Description of the Related Art

In scanning electron microscopy, an electron beam emitted by an electron gun is focused onto a specimen by condenser lenses and an objective lens. The electron beam is scanned in two dimensions. As the specimen is irradiated with the electron beam, secondary electrons and other electrons are produced. These produced electrons are detected with a detector. The output signal from the detector is supplied to a cathode-ray tube synchronized to the scanning of the electron beam. Thus, a scanned image of the specimen is obtained.

Where an image of a specimen is observed using such a scanning electron microscope, the specimen stage is mechanically translated in the X- or Y-direction, rotated, or tilted to permit the operator to observe an image of a desired area on the specimen. Movements and rotations of the observed area are not limited to mechanical ones. They may also be accomplished by the images-shifting function for controlling the range in which the electron beam is deflected and by the scan rotation function for electrically rotating the direction of the two-dimensional scan of the electron beam.

Where a specimen is rotated mechanically and an observation is made on this scanning electron microscope, X-motion, Y-motion, and rotation are interlinked such that the center of the viewing screen of the monitor acts as the center of rotation. Where specimens are imaged in a scanning electron microscope, various morphologies of specimens are observed. Sometimes, the operator wants to rotate a specimen image under observation.

Conventionally, where a specimen image on the viewing screen is rotated and observed, horizontal and scanning signals are added to a scanning signal applied to a deflector that scans the electron beam directed to the specimen. In this way, the region scanned by the electron beam is rotated.

In this case, as shown in FIG. 1, the observed image can be rotated while taking the center of the observed image as the center of rotation of the image. In FIG. 1, if the image is rotated through 90° while taking the center C of the viewing screen D as the center of rotation, an image 1 indicated by the solid line rotates into a posture as indicated by the broken line 2. FIG. 2 shows one example of an eucentric stage.

In FIG. 2, a Z-stage 3 moves in the direction of height, i.e., in the Z direction. A Y-stage 4 moving in the Y direction, an X-stage 5 moving in the X direction, and a rotating stage 6 rotating about the Z axis are placed on the Z-stage 3. A specimen (not shown) is placed on the rotating stage 6. This Z-stage 3 is equipped with an appropriate mechanism to permit tilting.

In the specimen stage assembly of the construction shown in FIG. 2, as long as the optical axis O, the tilting axis, and the axis of rotation are made coincident, the center position of the observed image is kept on the optical axis if the stage is tilted or rotated. Hence, the specimen image can be prevented from escaping when it is tilted or rotated. That is, where a mechanical rotation is made, if the center of rotation of the stage assembly is coincident with the center of the observed image, the image rotates about the center of the viewing screen, in the same way as where the image is rotated by a scanning signal.

However, with the specimen stage assembly structure shown in FIG. 2, if the observed position of the specimen is moved by translation of the X-Y stage (including the X-stage 5 and the Y-stage 6), the center of rotation also moves. As a result, the center of rotation is no longer coincident with the center of the observed image. This is illustrated in FIGS. 3(a) and 3(b). Where the center of mechanical rotation Cm is spaced from the center of image Cd as shown in FIG. 3(a), if the stage assembly is rotated through 90° mechanically, an image 1 lying in the center of the viewing screen as indicated by the solid line moves and appears as an image 2 as indicated by the broken line as shown in FIG. 3(b). Consequently, the range of the observed image shifts greatly.

SUMMARY THE INVENTION

In view of the foregoing, the present invention has been made.

It is an object of the present invention to provide a scanning charged-particle beam instrument in which an observed image is prevented from escaping due to rotation, even if the center of mechanical rotation is not coincident with the center of the image.

The present invention provides a scanning charged-particle beam instrument having a specimen stage assembly that is a combination of an X-Y stage and a rotating stage. The instrument directs a charged-particle beam to a specimen placed on the specimen stage assembly. The beam is scanned in two dimensions across the specimen. The instrument further includes a detector for detecting signals arising from the specimen when the specimen is illuminated with the beam as described above. In response to this, a scanned image of the specimen is displayed on a viewing screen. Let L be the distance between the center of the observed scanned image and the center of rotation of the rotating stage. This instrument is characterized in that it is further equipped with a control means for moving the X-Y stage according to the distance L and the angular position of the rotating stage such that the image rotates always about the center of the viewing screen when the rotating stage is rotated.

Other objects and features of the invention will appear in the course of the description thereof, which follows.

DESCRIPTION OF THE PREFERRED EMBODIMENT

Figure 4:
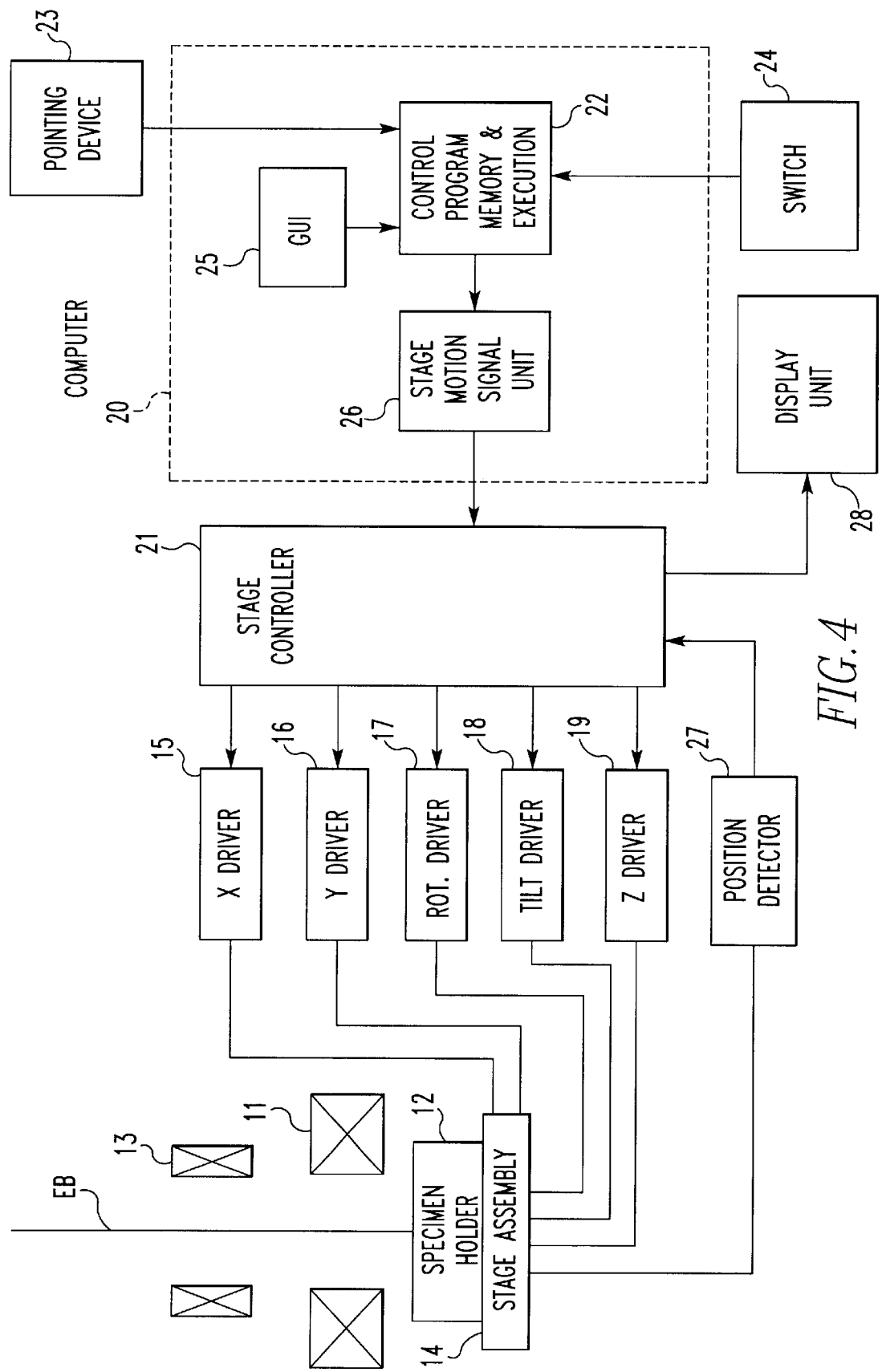
FIG. 4 is a block diagram of a scanning electron microscope in accordance with the present invention.

Referring to FIG. 4, there is shown a scanning electron microscope embodying the concept of the present invention.

This instrument has an electron gun (not shown) emitting an electron beam EB. This beam EB is accelerated and sharply focused on a specimen (not shown) via condenser lenses (not shown) and via an objective lens 11, the specimen being held to a specimen holder 12. The electron beam is scanned across a desired area on the specimen in two dimensions by deflection coils 13.

As the electron beam EE hits the specimen, secondary electrons are produced. These electrons are detected by a secondary electron detector (not shown). The output signal from the detector is appropriately amplified and converted into a digital signal by an A/D converter. The output signal from the converter is fed to an image memory, where the signal is stored. The signal stored in the memory is read out and supplied to a cathode-ray tube (CRT). As a result, a scanned image of the specimen is displayed on the CRT.

Figure 1:
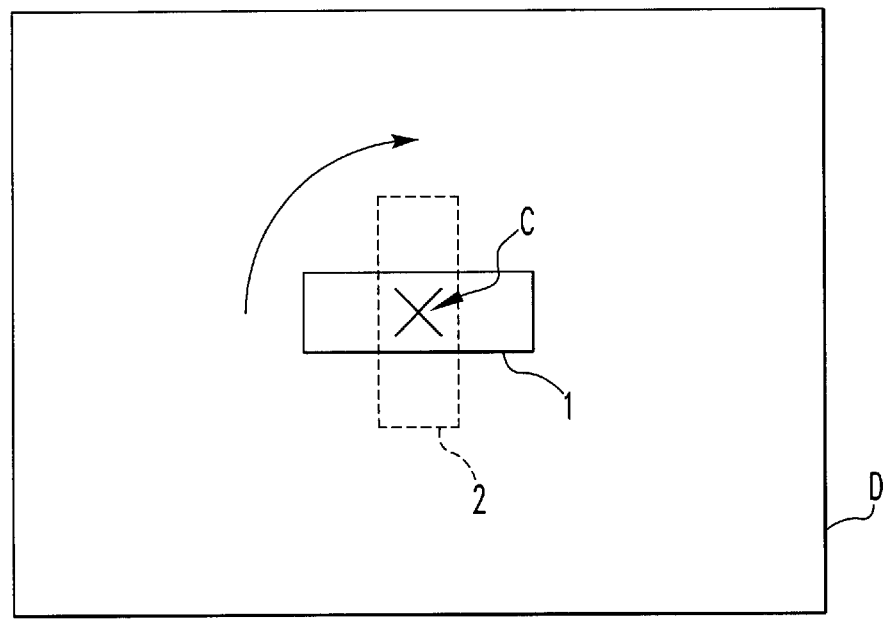
FIG. 1 is a diagram illustrating the manner in which the center of an image is coincident with the center of mechanical rotation in a scanning electron microscope.
Figure 2:
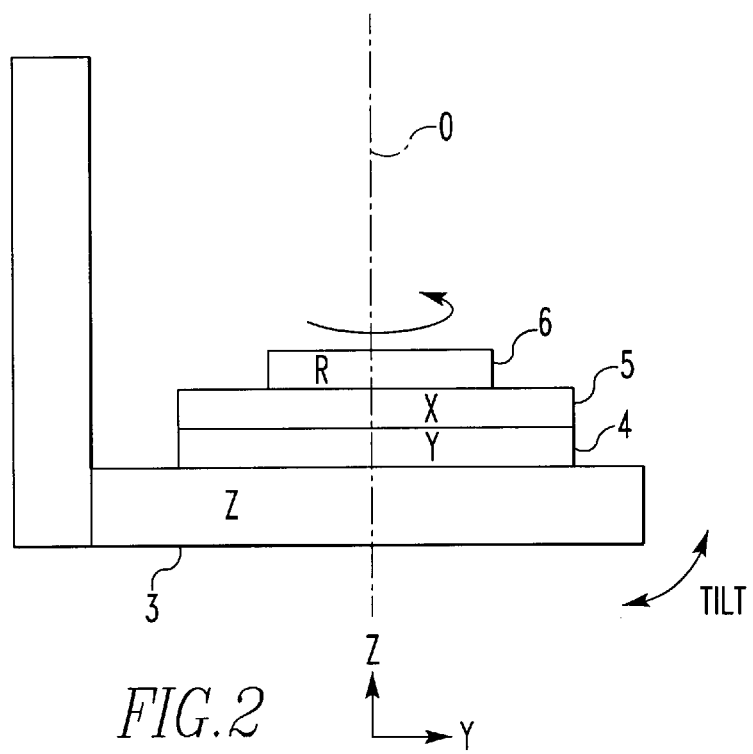
FIG. 2 is a side elevation of the prior art eucentric stage assembly used in a scanning electron microscope.
Figure 3B:
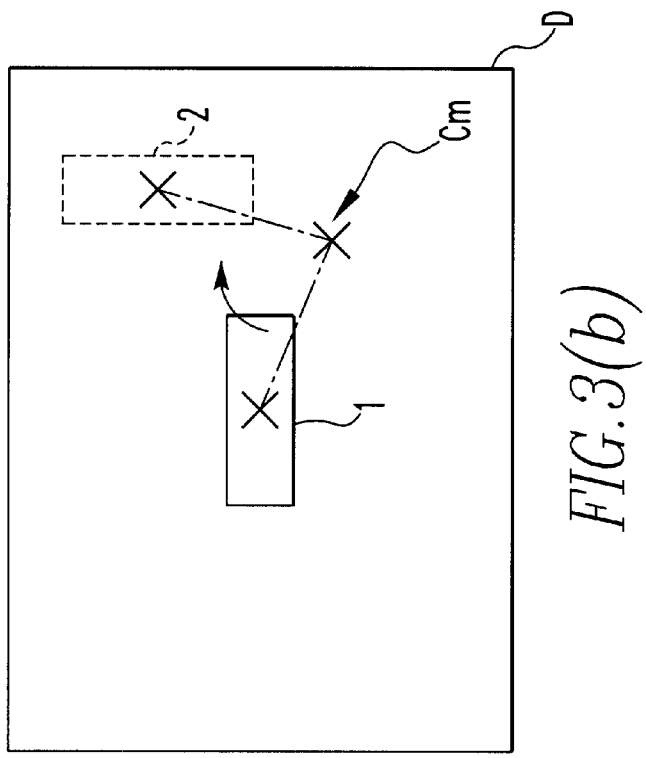
FIGS. 3(a) and 3(b) are diagrams illustrating the manner in which the center of an image is no longer coincident with the center of mechanical rotation after either the X-stage or the Y-stage of the eucentric stage assembly is translated.
Figure 3A:
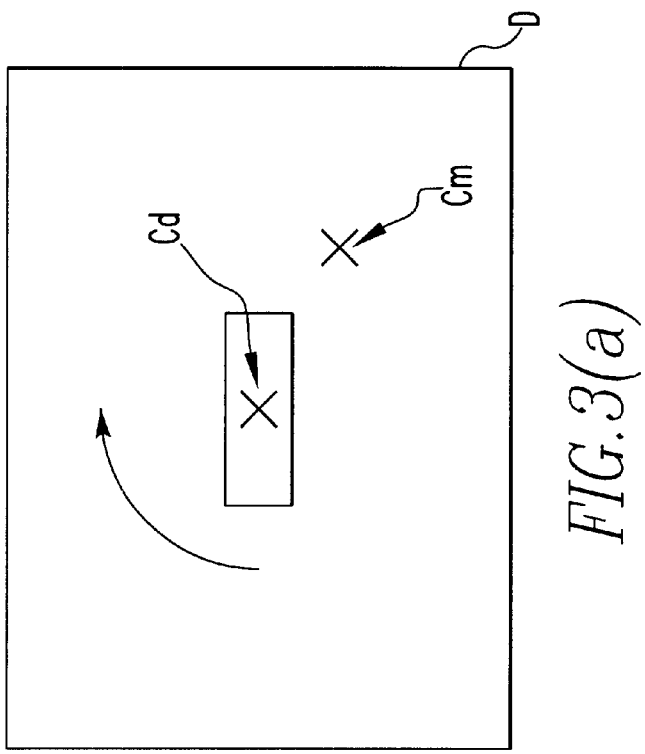

The specimen holder 12 is placed on a specimen stage assembly 14 that is of the eucentric structure shown in FIG. 2. The specimen stage assembly 14 comprises an X-motion stage, a Y-motion stage, a rotating stage, a tilting stage, and a Z-motion (elevation) stage. The X-stage of the specimen stage assembly 14 is driven by an X-motion driver circuit 15. The Y-motion stage is driven by a Y-motion driver circuit 16. The rotating stage is driven by a rotating stage driver circuit 17. The tilting stage is driven by a tilting stage driver circuit 18. The Z-motion stage is driven by a Z-motion driver circuit 19.

The X-motion driver circuit 15, the Y-motion driver circuit 16, the rotating stage driver circuit 17, the tilting stage driver circuit 18, and the Z-motion driver circuit 19 are controlled by a stage controller 21, which is under control of a digital computer 20. Control software 22 for control of the specimen stage assembly as described later is loaded in the digital computer 20.

A pointing device 23 such as a joystick is used to command X-motion, Y-motion, and rotation. A switch 24 is used to enable or disable eucentric operation. The control program 22 is operated according to the output signals from these pointing device 23 and switch 24.

This software 22 is also operated according to a signal from a graphical user interface (GUI) 25 that commands a rotary operation. Values of the signal that are obtained by the software 22 are supplied to the stage controller 21 via a stage-motion signal unit 26.

The specimen stage assembly 14 is translated horizontally or in the direction of the height, tilted, or rotated by the various driver circuits. The position of the specimen stage assembly after translation, tilting, or rotation is detected by a position detector 27. The output signal from the position detector 27 is supplied to a stage position display unit 28 via the stage controller 21. Thus, the state of the specimen stage assembly is displayed on the display unit 28. The operation of this structure is next described in detail.

In secondary electron imaging, the electron beam EB emitted by the electron gun (not shown) is accelerated and sharply focused on the specimen (not shown) via the condenser lenses (not shown) and via the objective lens 11, the specimen being held to the specimen holder 12. The electron beam is scanned across a desired area on the specimen in two dimensions by the deflection coils 13.

As the electron beam EB hits the specimen, secondary electrons are produced. These electrons are detected by the secondary electron detector (not shown). The output signal from the detector is appropriately amplified and converted into a digital signal by the A/D converter. The output signal from the converter is fed to the image memory, where the signal is stored. The signal stored in the memory is read out and supplied to the cathode-ray tube (CRT). As a result, a scanned image of the specimen is displayed on the CRT.

Where the specimen image displayed on the CRT is rotated, if the center of mechanical rotation is coincident with the center of the image, then the image does not escape during the rotation. However, if they do not agree, the center of the unrotated image is brought into other position after rotation. The operation performed where the center of mechanical rotation is not coincident with the center of the image in this way is next described by referring to FIG. 5.

Figure 5:
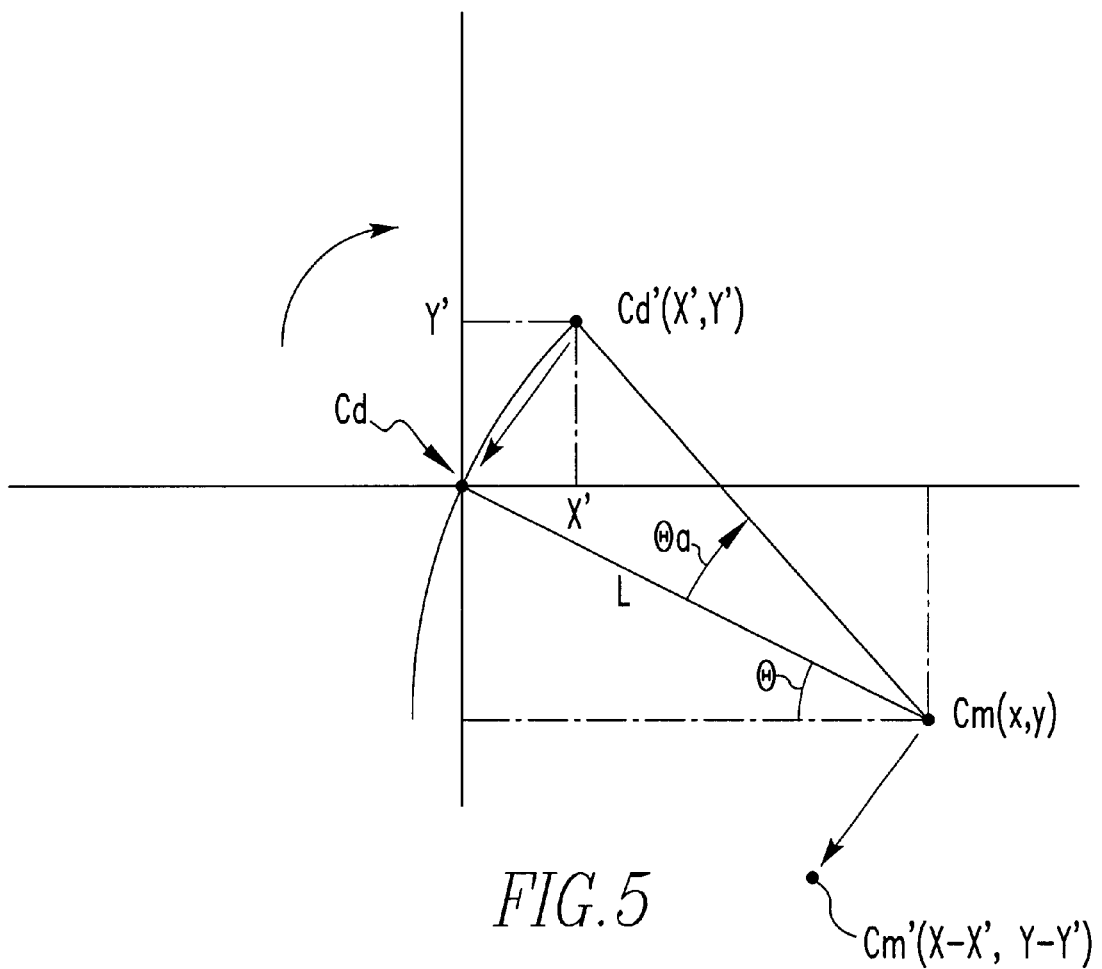
FIG. 5 is a diagram illustrating a corrective operation accompanying a mechanical rotation made in the microscope shown in FIG. 4.

In FIG. 5, Cd indicates the center of the viewing screen. Cm indicates the center of a mechanical rotation. It is assumed that the center of the viewing screen Cd lies at the origin of a coordinate system. The coordinates of the center of the mechanical rotation Cm are given by (X, Y). Under this condition, if an operator manipulates the pointing device 23 to rotate the rotating stage included in the specimen stage assembly 14 through an angle of θa, the center of the image Cd will move into a position Cd' (X', Y') unless any special corrective operation is performed.

In the present invention, if a mechanical rotation is made, the center of the image is kept at the center of the viewing screen Cd. For this purpose, if the stage assembly is mechanically rotated, the X-stage is driven to move a distance of –X' in the X-direction, and the Y-stage is driven to move a distance of –Y' in the Y-direction.

Before the stage assembly is rotated, the present position of the stage assembly is detected by the position detector 27 and stored in the digital computer 20 via the stage controller 21. The deviation (X, Y) of the center of mechanical rotation Cm from the origin of the coordinate system is found. Then, the distance L between the center of rotation Cm and the center of the image Cd is calculated, using an equation $L=\sqrt{X^2+Y^2}$. Also, the angle θ is computed, using an equation $\theta=\tan^{-1}(Y/X)$.

Where the stage assembly is mechanically rotated through the angle θa by the rotating stage driver circuit 17, the X-stage is driven to move a distance of –X' in the X-direction and to cause the Y-stage to move a distance of –Y' in the Y-direction. The image is rotated without moving the center of the image. In this case, amounts of correction X' and Y' are given by $X'=X-L\times\cos(\theta+\theta a)$ $Y'=Y+L\times\sin(\theta+\theta a)$ These amounts of correction are calculated by the stage-motion control software 22 loaded in the digital computer 20. Also, the software 22 causes the driver circuit to perform control operations according to the amounts of correction. At this time, if the rotating stage is rotated through the angle θa (=Δθ×n) in increments of Δθ across n angular positions, the amounts of correction X' and Y' are calculated at each of the n angular positions. The position of the X-Y stage is corrected at each of the n angular positions, because whenever the X and Y coordinates are corrected during rotation, the center of rotation of the rotating stage moves, too. The fineness of the increments of the angle θa depends on the smoothness of rotary movement.

The angle θa corresponds to the amount of one step of the motor for driving the rotating stage. The position of the X-Y stage can be corrected most accurately by correcting the position of the X-Y stage in this way. The position of the X-Y stage may also be corrected whenever the motor for driving the rotating stage rotates plural steps.

Alternatively, in order that the image be rotated always about the center of the viewing screen when the rotating stage is rotated, the amounts of correction X' and Y' made to the X and Y coordinates, respectively, of the X-Y stage at each of the angular positions Δθ, 2Δθ, 3Δθ, and so forth may be stored in a memory, for each different value of the coordinates Cm (X, Y) of the center of rotation of the rotating stage assumed at the beginning of rotation. The amounts of correction made to the X and Y coordinates may be read from the memory according to the coordinates Cm (X, Y) of the center of rotation of the rotating stage assumed at the beginning of rotation and according to the angular position of the rotating stage.

In this case, some different sets of coordinates are taken as the center of the rotating stage and represent all the coordinates of the center of rotation. Corrective data X' and Y' about these representative X and Y coordinates are stored in the memory. This memory has a function of performing calculations for interpolation. Where the position of the X-Y stage is corrected in practice, the corrective data about the X and Y coordinates of the X-Y stage are found by interpolation from the previously stored corrective data according to the coordinates of the center of rotation assumed at the beginning of the rotation and according to the angular position of the rotating stage. Then, the found data are read out by the control means, and the position of the X-Y stage is corrected.

Where the center of mechanical rotation deviates from the center of the image, if the stage assembly is rotated mechanically, the operations described above permit the image to be rotated about the center of the observed image. After making corrections to the rotation, the center of mechanical rotation moves into position Cm'.

Where the stage assembly is rotated mechanically, if the translational speed of the stage assembly in the X and Y directions is made constant irrespective of the distance L between the center of rotation and the center of the observed image, the center of rotation is not coincident with the center of the viewing screen. That is, at some value of the distance L, the image can be rotated about the center of the observed image. However, at other values of the distance L, as the stage assembly is rotated, the center shifts across the viewing screen and returns to the center finally.

Accordingly, in the present invention, the distance L between the center of mechanical rotation and the center of the observed image is linked to the moving speed of the X-Y stage. The apparent rotational speed of the image on the viewing screen is made constant, regardless of the value of the distance L. In practice, the instrument is so controlled by the stage-motion control software that the moving speed of the X-Y stage increases with increasing the distance L. The time in which the X-Y stage moves from the coordinates X', Y' into the coordinate system origin shown in FIG. 5 is maintained constant, irrespective of the value of the distance L.

Where one wants to observe an image using only rotation in such a manner that the center of the image moves naturally without operating the instrument in such a way that the center of the observed image is fixed even if mechanical rotation is made as described above, the operator operates the switch 24 to turn off the eucentric operation and to stop the operation of the stage-motion control software 22.

While the preferred embodiment of the present invention has been described in detail thus far, the invention is not limited thereto. For example, in the embodiment described above, during a rotational operation, a correction by rotation is made at every given angular step. Alternatively, the X and Y coordinates may be directly brought to desired values simultaneously with rotation without moving the stage assembly in steps. Especially, where the operator directly commands a desired angular position and a rotation is made, the value of the commanded angular position may be directly calculated, and corrective movements for the X and Y coordinates may be made. In the description provided above, a scanning electron microscope is taken as an example. The invention can also be applied to an instrument in which an ion beam is scanned across a specimen.

As described thus far, the present invention provides a scanning charged-particle beam instrument having a specimen stage assembly that is a combination of an X-Y stage and a rotating stage. A specimen is placed on the specimen stage assembly. The instrument directs a charged-particle beam to the specimen. The beam is scanned across the specimen in two dimensions. Signals arising from the specimen in response to the beam hitting the specimen are detected, and a scanned image of the specimen is displayed on a viewing screen in response to the detected signals. The X-Y stage is moved according to the distance L between the center of rotation of the observed image and the center of rotation of the rotating stage and according to the angular position of the rotating stage such that the image rotates always about the center of rotation of the rotating stage when the rotating stage is rotated. Therefore, if the position of the center of the image deviates from the mechanical angular position, and if the stage assembly is mechanically rotated, the image can be rotated about the center of the viewing screen.

What is claimed is:

1. A scanning charged-particle beam instrument comprising:
   a specimen stage assembly including a combination of an X-Y stage for translation along X and Y axes and a rotating stage secured to said X-Y stage, said rotating stage having a center of rotation and a rotation axis normal to the X and Y axes;
   means for directing a charged-particle beam to a specimen placed on said specimen stage assembly;
   means for scanning said charged-particle beam in two dimensions across said specimen;
   a detector for detecting signals arising from said specimen;
   means for displaying a scanned image of said specimen on a viewing screen in response to an output signal from said detector, said scanned image having a selected position that is at a distance of L from the center of rotation of said rotating stage; and
   a control means for repositioning said X-Y stage according to the angular rotation of said rotating stage and the said distance L such that the scanned image rotates about the selected position on the viewing screen and such that said control means controls the moving speed of said X-Y stage according to said distance L.

2. The scanning charged-particle beam instrument of claim 1, wherein said control means increases the moving speed of said X-Y stage with increasing the distance L.

3. A scanning charged-particle beam instrument comprising:
   a specimen stage assembly including a combination of an X-Y stage for translation along X and Y axes and a rotating stage, said rotating stage having a center of rotation about a third axis;
   means for directing a charged-particle beam to a specimen placed on said specimen stage assembly generally along the third axis;

means for scanning said charged-particle beam in two dimensions across said specimen;

a detector for detecting signals arising from said specimen;

means for displaying a scanned image of said specimen on a viewing screen in response to an output signal from said detector;

storage means in which amounts of correction made to X and Y coordinates of said X-Y stage to cause said scanned image to be rotated about the center of said viewing screen when said rotating stage is mechanically rotated are stored together in a table with corresponding angular positions of said rotating stage for different X and Y coordinates of the center of rotation of said rotating stage; and means for prior to a given rotation reading said amounts of correction from said storage means according to the X and Y coordinates of the center of rotation of said rotating stage at the beginning of a rotation and according to the angle of the given rotation.

4. The scanning charged-particle beam instrument of any one of claims 1, 2, and 3, further comprising a means for stopping the movement of said X-Y stage during rotation of said rotating stage.

* * * * *